United States Patent
Hill et al.

(10) Patent No.: US 10,642,320 B2
(45) Date of Patent: May 5, 2020

(54) DRIVE CARRIER AND METHOD THEREFOR

(71) Applicant: Sanmina Corporation, San Jose, CA (US)

(72) Inventors: Charles C. Hill, Portland, OR (US); Franz Michael Schuette, Colorado Springs, CO (US)

(73) Assignee: SANMINA CORPORATION, San Jose, CA (US)

( * ) Notice: Subject to any disclaimer, the term of this patent is extended or adjusted under 35 U.S.C. 154(b) by 0 days.

(21) Appl. No.: 16/265,656

(22) Filed: Feb. 1, 2019

(65) Prior Publication Data
US 2019/0246514 A1    Aug. 8, 2019

Related U.S. Application Data

(60) Provisional application No. 62/625,804, filed on Feb. 2, 2018.

(51) Int. Cl.
| | |
|---|---|
| *G06F 1/18* | (2006.01) |
| *G11B 33/04* | (2006.01) |
| *H05K 7/14* | (2006.01) |
| *G11B 33/12* | (2006.01) |

(52) U.S. Cl.
CPC .......... *G06F 1/187* (2013.01); *G11B 33/0433* (2013.01); *G11B 33/122* (2013.01); *G11B 33/124* (2013.01); *G11B 33/126* (2013.01); *G11B 33/128* (2013.01); *H05K 7/1487* (2013.01); *H05K 7/1489* (2013.01)

(58) Field of Classification Search
CPC ..... H05K 7/1487; H05K 7/1489; G06F 1/187
See application file for complete search history.

(56) References Cited

U.S. PATENT DOCUMENTS

| | | | | |
|---|---|---|---|---|
| 6,270,174 | B1* | 8/2001 | Nishi | G06F 1/181 |
| | | | | 312/223.1 |
| 6,351,379 | B1* | 2/2002 | Cheng | G11B 33/128 |
| | | | | 312/332.1 |
| 8,077,467 | B2* | 12/2011 | Chen | G11B 33/128 |
| | | | | 312/223.2 |
| 8,248,775 | B2* | 8/2012 | Zhang | G11B 33/124 |
| | | | | 248/27.1 |
| 2005/0111178 | A1* | 5/2005 | Bradley | G06F 1/184 |
| | | | | 361/679.38 |
| 2007/0019379 | A1* | 1/2007 | Hsiao | G06F 1/184 |
| | | | | 361/679.02 |

\* cited by examiner

*Primary Examiner* — Nidhi Thaker
(74) *Attorney, Agent, or Firm* — Loza & Loza, LLP; Julio M. Loza; Heidi L. Eisenhut (57) ABSTRACT

One feature pertains to a scissor-based carrier assembly for a mass storage device used in a storage computer system. The carrier assembly has fixed and moving parts allowing the carrier to change from a retracted state to insert or remove the mass storage device into or from a storage enclosure to an extended state to couple the mass storage device with a connector of the storage computer system.

16 Claims, 10 Drawing Sheets

DRIVE CARRIER AND METHOD THEREFOR

CLAIM OF PRIORITY UNDER 35 U.S.C. § 119

The present Application for Patent claims priority to U.S. Provisional Application No. 62/625,804 entitled "Drive Carrier and Method Therefor", filed Feb. 2, 2018, and assigned to the assignee hereof and hereby expressly incorporated by reference herein.

FIELD

The present disclosure generally relates to server computers and other processing apparatuses. More particularly, the present disclosure relates to a novel drive carrier which allows for vertical insertion of horizontally mounted drives into server enclosures and just another bunch of drives (JBOD) appliances.

BACKGROUND

Figure 1A:
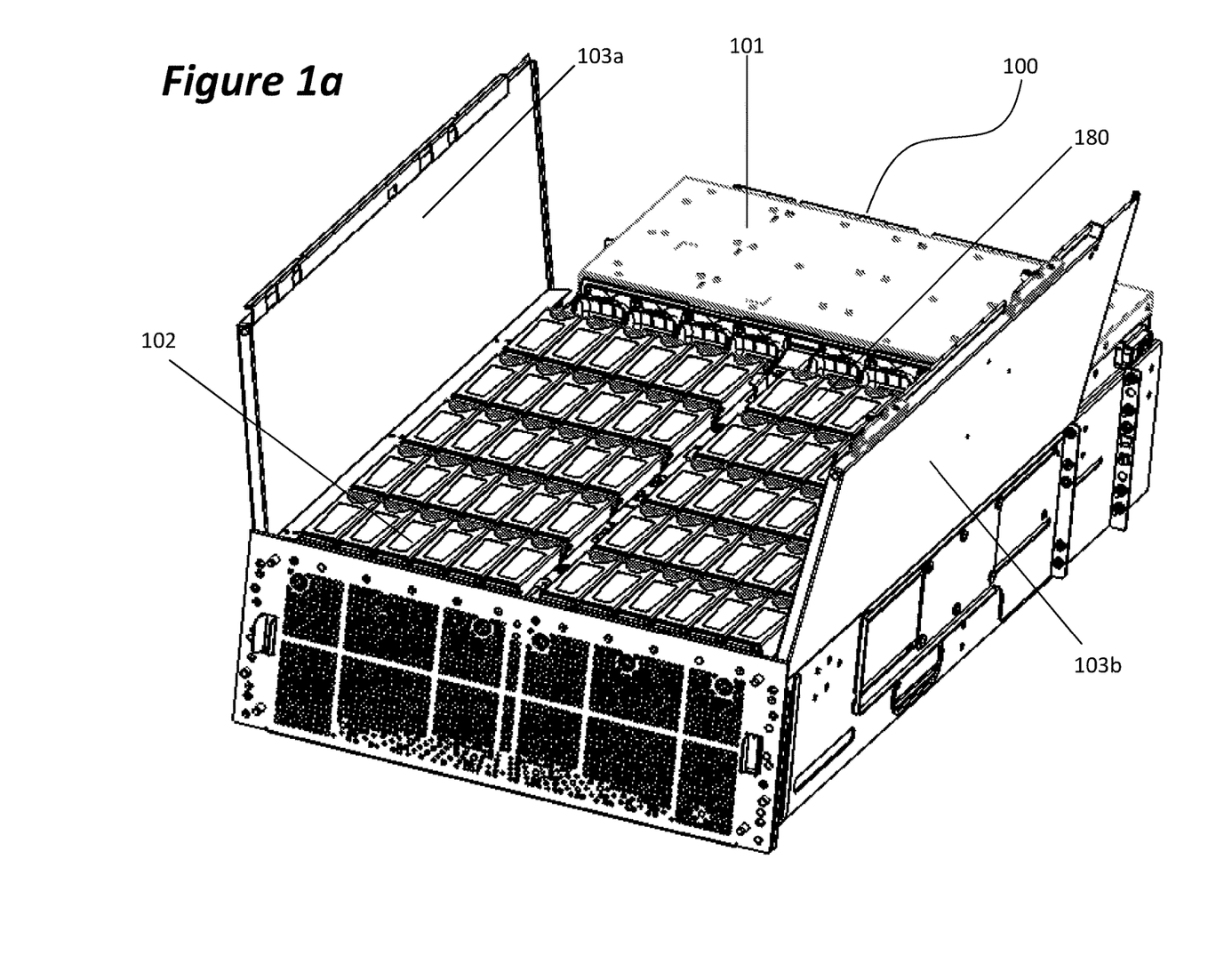
FIGS. 1A and 1B illustrate isometric views of a top-loading server.
Figure 1B:
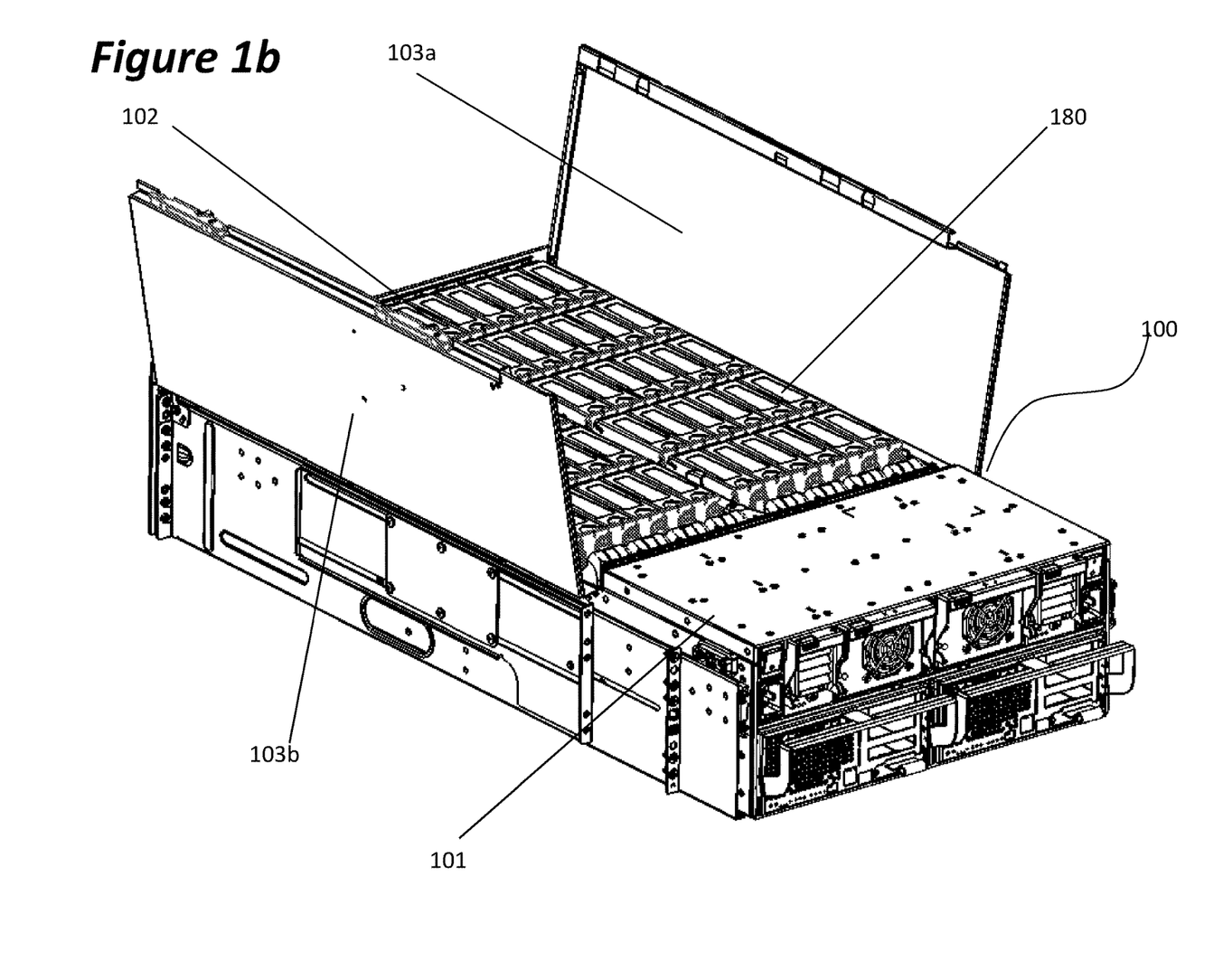

Server computers, as deployed in data centers, can be categorized as either top-loading or front/back loading. FIGS. 1A and 1B illustrate an example of a top-loading server. The server enclosure 100, which has a server compartment 101 and a drive bay 102 is shown pulled out of a rack with the top lids 103a, 103b in an open configuration. As shown, mass storage devices such as hard disk drives (HDDs) or solid state drives (SSDs) 180 are inserted from the top of the server enclosure 100 to mate with connectors on a base board which is functionally connected with some logic. In the case of 3.5" large form factor (LFF) drives, this design is highly efficient and allows for the densest packing of storage media while maintaining the best possible service model.

Figure 2:
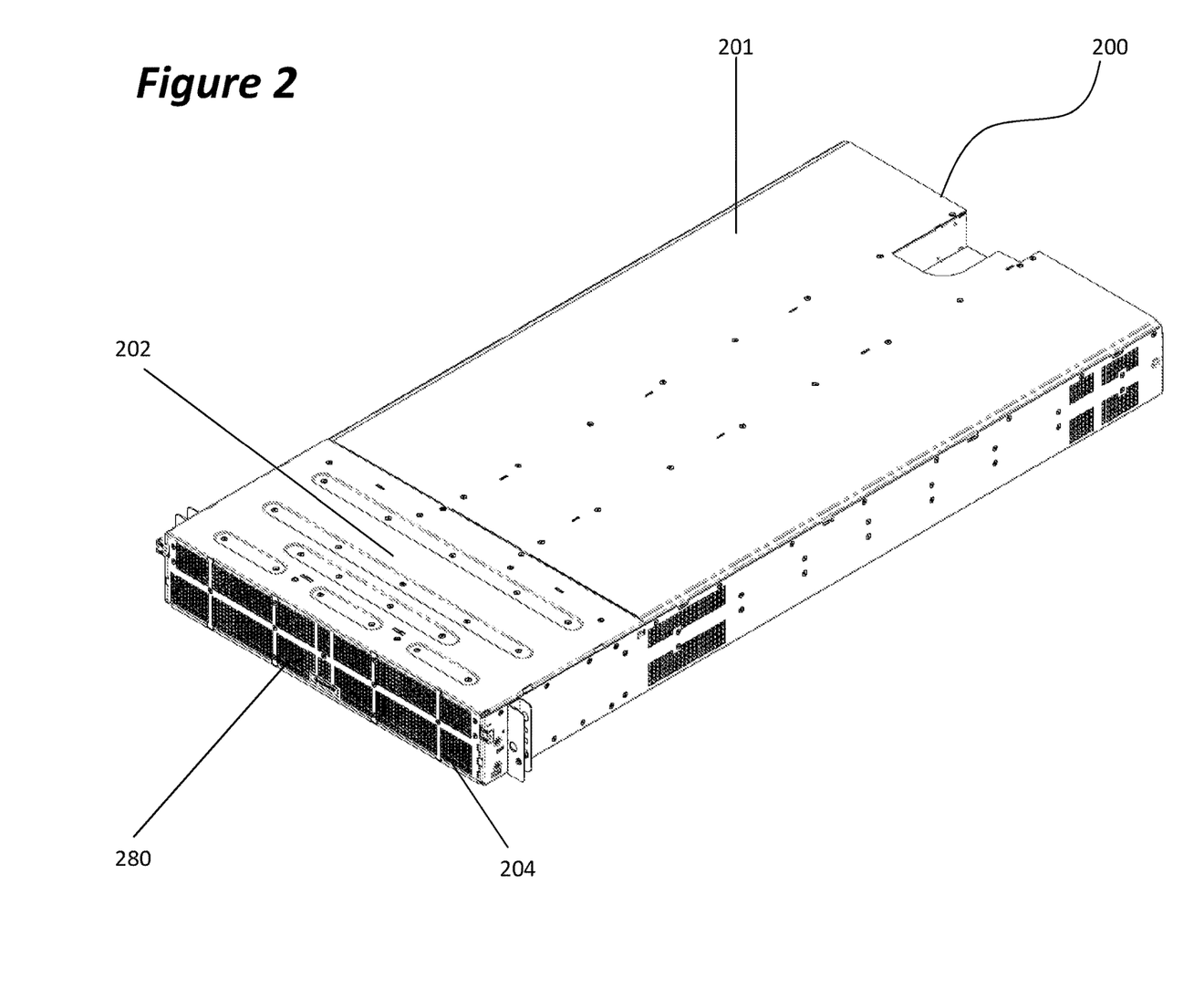
FIG. 2 illustrates an isometric view of a front/back loading server.

A front/back (or rear) loading server enclosure 200 is shown in FIG. 2. As shown, the drives 280 are inserted horizontally into the open front or back end 204 of the server enclosure 200 which makes up the drive bay 202 of the enclosure 200 to mate with a back plane, drive plane or mid plane. The mid plane provides the electrical interface for the drives with a compute node installed in the compute compartment of the enclosure 200. This design allows for fixed mounting of the server in a rack where the drives are simply pulled out or inserted by operating a lever on a drive carrier to cam the drive's connector in and out of the mating connector on the drive plane. The distinction of front vs. rear loading only refers to the drives facing the hot or cold isle, respectively, in a data center.

Front and rear loading server designs have the disadvantage of allowing only a relatively small number of drives as defined by the cross sectional area of the server's face. For example, a 2 U height server in a standard 19" rack can accommodate twenty four 2.5" small form factor (SFF) drives or 12 3.5" LFF drives. Of particular relevance is the use of 2.5" SFF drives in vertical orientation that fit into the envelope of a 2 U server with 3.5" outside z-height. A variant of this design is a side loading server 300 shown in FIG. 3, in which both sides can be used to insert drives in to a drive bay 302 extending behind the compute enclosure 301. In a 2 U enclosure, 30 drives 380 per side can be inserted horizontally through an opening 304 into the drive bay 302, however, in a 19" rack width configuration, this leaves a large center channel of the enclosure as unused space. The drives can be standing on edge as shown or lying flat, depending on the specific design.

Several mechanisms have been developed to utilize this unused space including cantilevered drive planes but all currently available solutions are mechanically overly complicated, problematic with respect to signal integrity and/or expensive to manufacture.

In light of the above it is clear that simpler and more robust solutions are needed that better utilize the existing footprint of servers with SFF drives.

SUMMARY

The following presents a simplified summary of one or more implementations in order to provide a basic understanding of some implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

In one aspect of the present disclosure, a computer system has an enclosure configured to accept a plurality of mass storage devices. The computer system may be a server or a "just another bunch of drives" (JBOD) appliance. Each one of the mass storage devices is assembled together with a carrier assembly. The carrier assembly is adapted to change from a retracted to an extended state to allow the assembled carrier in its retracted state with the mass storage device to be inserted into the enclosure. The extended state is used to engage the mass storage device with a connector of the computer system. A scissor mechanism actuates the carrier between the retracted and the extended state.

The carrier assembly has a front plate extending into an upper fixed plate and a lower fixed plate with an upper sliding rail attached to the upper fixed plate and a lower sliding rail attached to the lower sliding rail. A scissor mechanism with a first member pivoting against the front plate and a second member pivoting against the upper sliding rail is used to move the upper sliding rail along the upper fixed plate such that folding the scissor mechanism retracts the upper sliding rail towards the front plate and flattening the scissor mechanism extends the upper sliding rail away from the front plate.

The carrier assembly may further include a first fastening structure of the upper sliding rail to attach to a mass storage device and a second fastening structure of the lower sliding rail to attach to the mass storage device. Since the two sliding rails are fixed by the drive relative to each other, the lower sliding rail moves in substantially the same way as the upper slide rail when the scissor mechanism is actuated.

In another aspect, the carrier assembly may extend into a key to engage with a key-hole in the enclosure. The key secures the carrier assembly in the extended state within the enclosure. Retention features such as a pin engaging with a hole in the enclosure sheet metal maintain alignment of the carrier with a structure of the enclosure.

In another aspect of the carrier assembly, the upper and lower fixed plates have an elongated hole configured to allow for travel of a retaining structure securing the mass storage device within the carrier.

In yet another aspect, a member of the scissor mechanism extends into a latch.

Another aspect of the present disclosure provides a method for inserting a mass storage device into a storage enclosure. The method comprises (1) installing the mass storage device in a carrier assembly; (2) actuating a scissor mechanism on the carrier assembly from a flat configuration to a folded configuration to change the state of the carrier assembly from an extended state to a retracted state; (3) inserting the carrier assembly into a drive slot in the storage enclosure; and (4) actuating the scissor mechanism from the folded configuration to the flat configuration to change the state of the carrier assembly from the retracted state to the extended state.

According to another aspect of the method of the present disclosure, the carrier assembly has a front plate extending into an upper fixed plate and a lower fixed plate. An upper sliding rail is attached to the upper fixed plate and a lower sliding rail is attached to the lower fixed plate. The scissor mechanism has a first member pivoting against the front plate and a second member pivoting against the upper sliding rail. Folding the scissor mechanism retracts the upper sliding rail towards the front plate whereas flattening the scissor mechanism extends the upper sliding rail away from the front plate.

In another aspect of the method of the present disclosure, a first fastening structure of the upper sliding rail may be used to attach the upper sliding rail to a mass storage device and a second fastening structure of the lower sliding rail may be used to attach the lower sliding rail to the mass storage device, the lower sliding rail moving in substantially the same way as the upper slide rail when the scissor mechanism is actuated.

In yet another aspect of the present disclosure, a key extension of the lower sliding rail engages with a key-hole in the enclosure. The key secures the carrier assembly in the extended state within the enclosure. Additional retention features maintain alignment of the carrier with a structure of the enclosure.

In another aspect of the method of the present disclosure, the upper and lower fixed plates have an elongated hole configured to allow for travel of a retaining structure securing the mass storage device within the carrier.

Another aspect of the present disclosure provides for a method for removing a mass storage device from a storage enclosure by actuating a scissor mechanism on a carrier assembly securing the mass storage device in a drive slot of the enclosure from a flat configuration to a folded configuration to change the state of the carrier assembly from an extended state to a retracted state and then removing the carrier assembly from the drive slot.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details.

In the following description, certain terminology is used to describe certain features of one or more embodiments. The term "SSD" may refer to any generation of solid state drive and its respective non-volatile memory as well as its protocol, the transmission lines and the transmit and receive logic. The term "drive plane" may refer to a back plane, a side plane or a front plane or any suited printed circuit board adapted to receive an SSD.

The present disclosure is directed to solving the problems of installing or removing SSDs or HDDs, hereafter collectively referred to as drives from a server enclosure. More specifically, the disclosure solves the problem of adding and removing drives using top-loading access into a configuration equivalent to a front or side loading arrangement.

Standardization of the form factors and sizes is important for efficient space utilization in data centers. Most current server computers deployed in data centers are rack-mounted computers conforming to standard-sized server cabinets or racks that are 19" wide and the height is typically given in multiples of rack units or U wherein 1 U equals 1.75". Common server heights are 1 U, 2 U, 4 U and component form factors have followed these predefined dimensions. For example, server power supply units are available in 1 U or 2 U height.

Other components, particularly those that require air flow for cooling are more of a loose fit, a case in point is the tombstone orientation of 3.5" LFF HDDs in a 4 U chassis as shown in FIGS. 1A and 1B. At 5" in length, these LFF HDDs fit into a 4 U top loading chassis 100 along with the circuit boards to logically and electrically connect them to a server while leaving enough of a plenum above and below for airflow to cool them. The chassis 100 shown as example has a server compartment 101 to house the power supplies and either server or input/output (IO) module canisters, and a drive compartment 102 to house the drives 180 that can be accessed after opening the top lid 103a,b.

Figure 3:
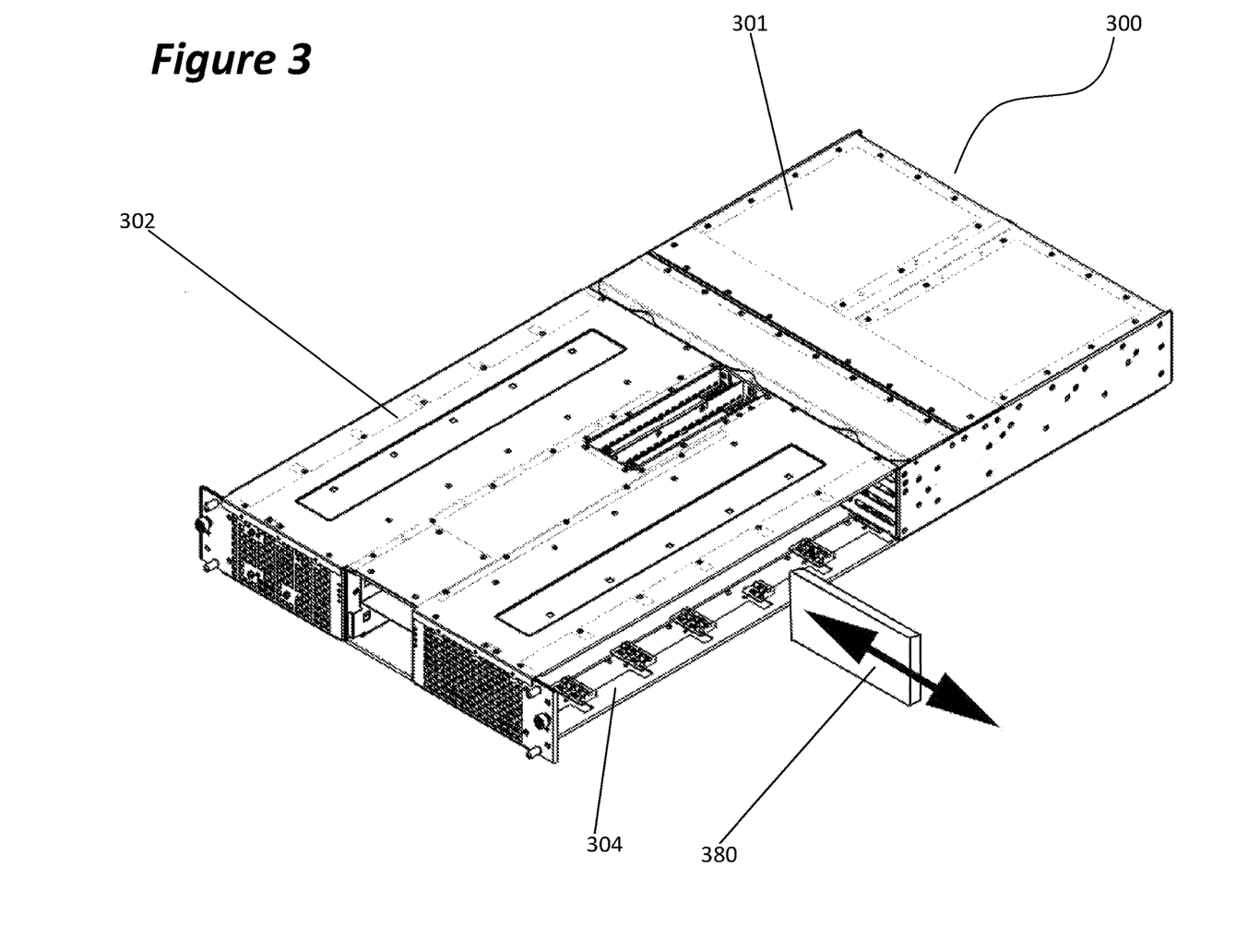
FIG. 3 illustrates an isometric view of a side-loading server.

A similar situation exists in a 2 U enclosure holding 2.5" SFF drives standing on their side edge and inserted through the front, back or side of the enclosure to mate with a vertically oriented drive plane. FIG. 2 shows such a front loading chassis 200 having a bezel 204 in front of the drive bay 202 for suppression of electromagnetic interference generated by the servers within the server compartment 201 or by the drives 280. FIG. 3 shows a side loading chassis 300 with the drive bays 304 on either side of the drive compartment 302 located behind the server compartment 301. The connector placement at the short edge of the drive 380 defines the insertion axis along the long side of the drive. The outside dimension height of the enclosure is 3.5", leaving approximately 1" for sheet metal, guides, drive carriers and any other supporting structure needed while providing some space for a plenum.

Any of the aforementioned configurations has the disadvantage of allowing a single row of drives at any given side of the enclosure, moreover, that side needs to be open, which leads to degradation of mechanical stability and a potential for skew and sagging of the enclosure as well as escaping of electromagnetic interferences. Accordingly, the solution sought is a drive mounting scheme that allows top loading of a side or front loading drive.

Figure 4A:
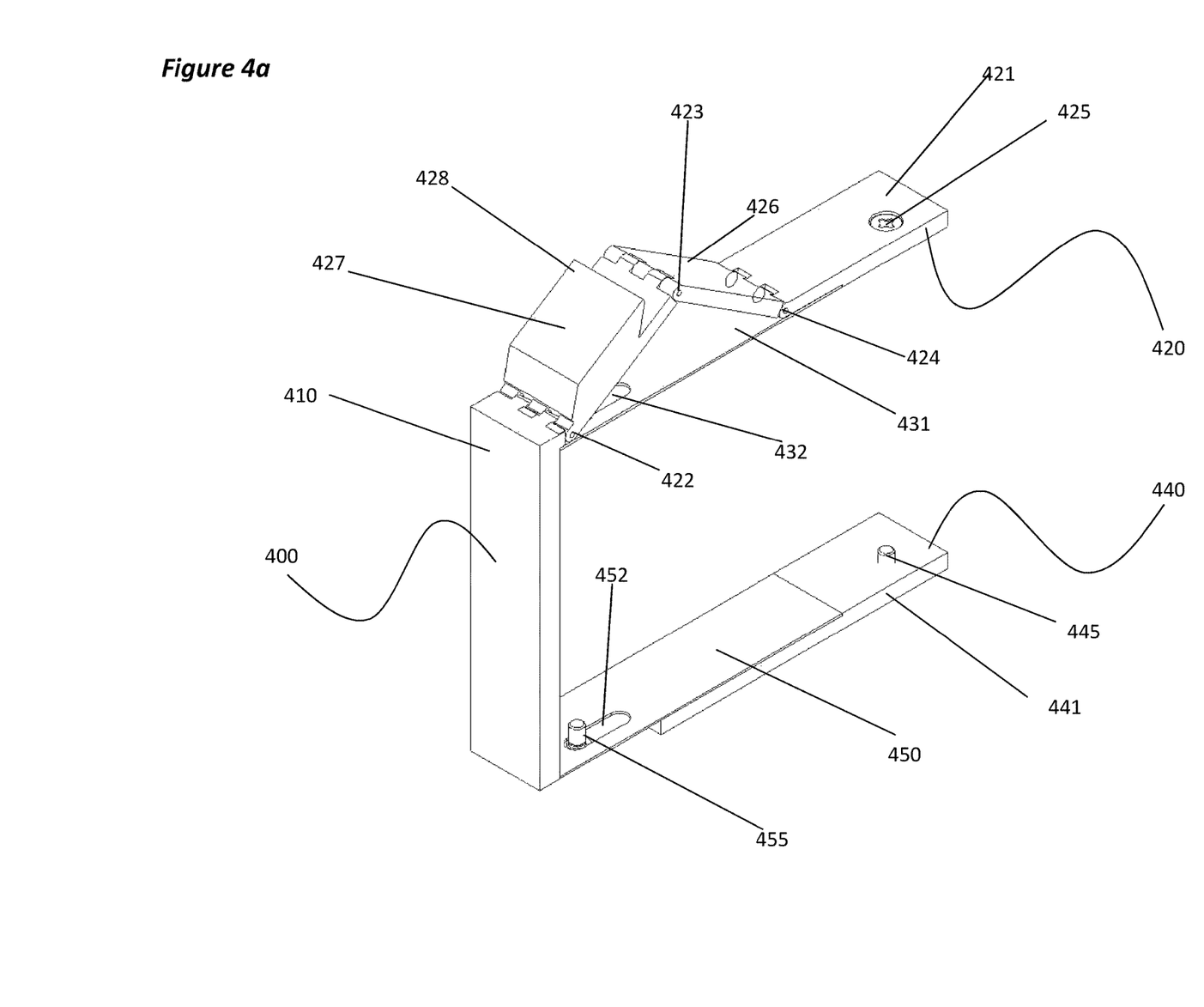
FIGS. 4A and 4B illustrate isometric views of a drive carrier.
Figure 4B:
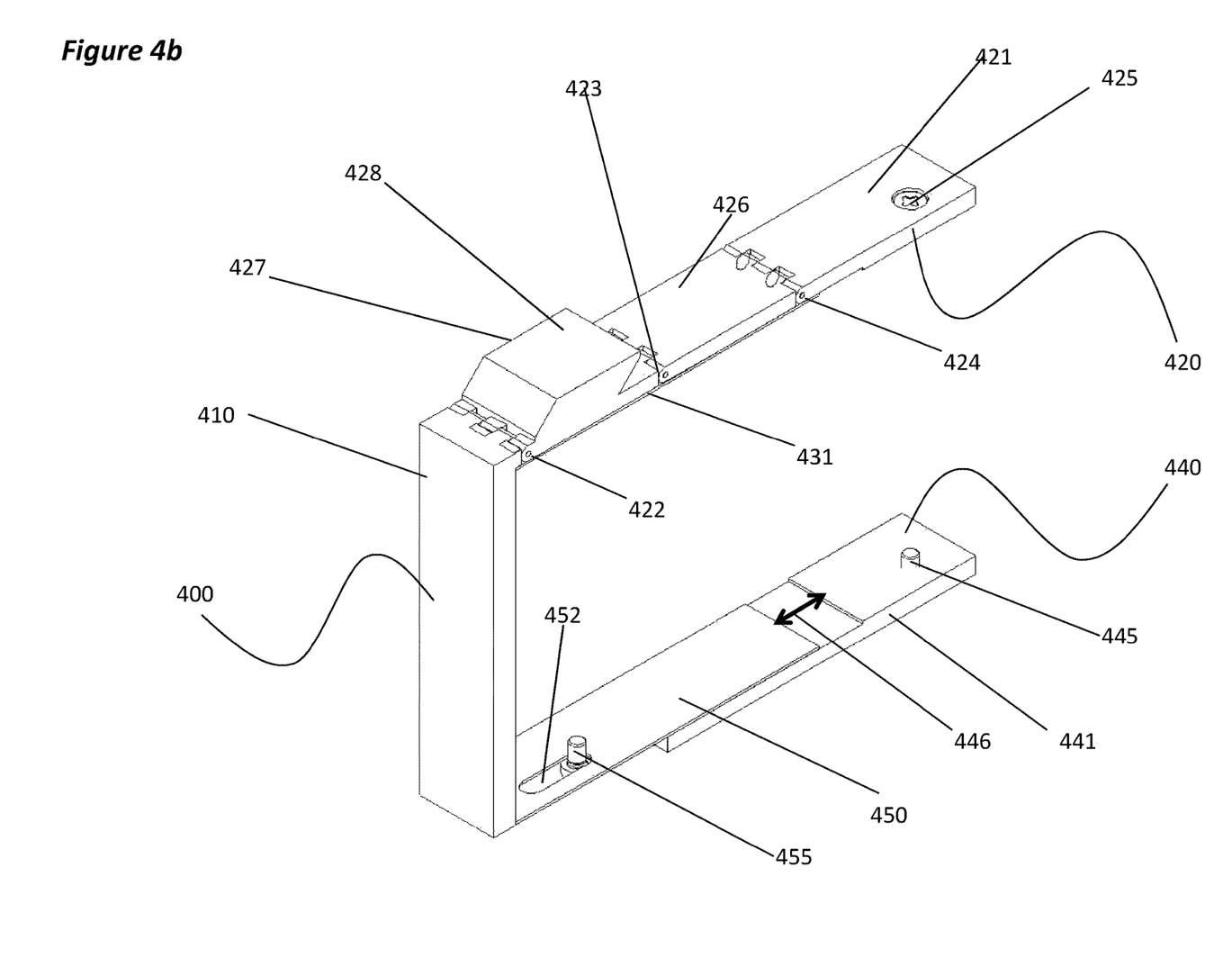

FIGS. 4A and 4B show isometric views of the two possible configurations of one aspect of the present disclosure. Referring to FIG. 4A, a drive carrier 400 has a front plate 410 extending into an upper bracket assembly 420 and a lower bracket assembly 440. The upper bracket assembly 420 may include four main parts: a first distal sliding rail 421, a first static plate 431 (or upper fixed plate), a first scissor member 426 and a second scissor member 427. The first distal sliding rail 421 may have a first structure 425 configured to engage with a mounting hole in a 2.5" SFF drive and secure the drive against the first distal sliding rail 421. The first structure 425 may be a screw or pin or any other suitable structure to engage an SFF drive with the first distal sliding rail 421. The first distal sliding rail 421 may be configured to slide in a long axis against the first static plate 431 to either an extended position (See FIG. 4B) or, as shown in FIG. 4A to a retracted position. The first static plate 431 may have an elongated slot 432 in which a second structure, such as a screw or pin (not shown), configured to engage with a drive can travel in the long axis direction.

The first distal sliding rail 421, against the first static plate 431, may be actuated by a scissor structure having a first member 426 attached with a first pivot pin 424 to the first distal sliding rail 421 and a second pivot pin 423 against a second member 427, which, in turn, is attached with a third pivot pin 422 to either front plate 410 or else static plate 431. A latch 428 for manual operation of the scissor structure may be part of the first member 426 or as shown in FIGS. 4A and 4B of the second member 427.

The lower bracket assembly 440 may have a second distal sliding rail 441 sliding on a second static plate 450 (or lower fixed plate). The second distal sliding rail 441 may have a second structure 445 similar to the first structure 425 as well as a key structure designed to engage with a keyhole guide slot in the enclosure to facilitate alignment of the drive's connector with the mating counterpart on the drive plane. The second static plate 450 (or lower fixed plate) has an elongated slot 452 in the longitudinal direction to allow the second structure 455, designed to engage with the drive, to travel longitudinally.

In the retracted configuration, the drive carrier 400 may be dropped from the top into an enclosure whereby an alignment key is inserted into an alignment keyhole slot of the enclosure. When the latch 428 is pushed down, the scissor mechanism extends and pushes the distal rails away from the front plate 410. This causes the drive to travel away from the front plate 410 and to engage with a connector mounted on a drive plate.

FIG. 4B shows the same drive carrier as FIG. 4A, however with the scissor mechanism pushed down, thereby forcing the upper rail (or the first distal sliding rail) 421 into the extended position. If a drive is installed into the carrier, the lower rail (or the second distal sliding rail) 441 is forced to follow the movement of the upper rail (or the first distal sliding rail) 421 and travel a distance 446 away from the front plate 410.

Figure 5:
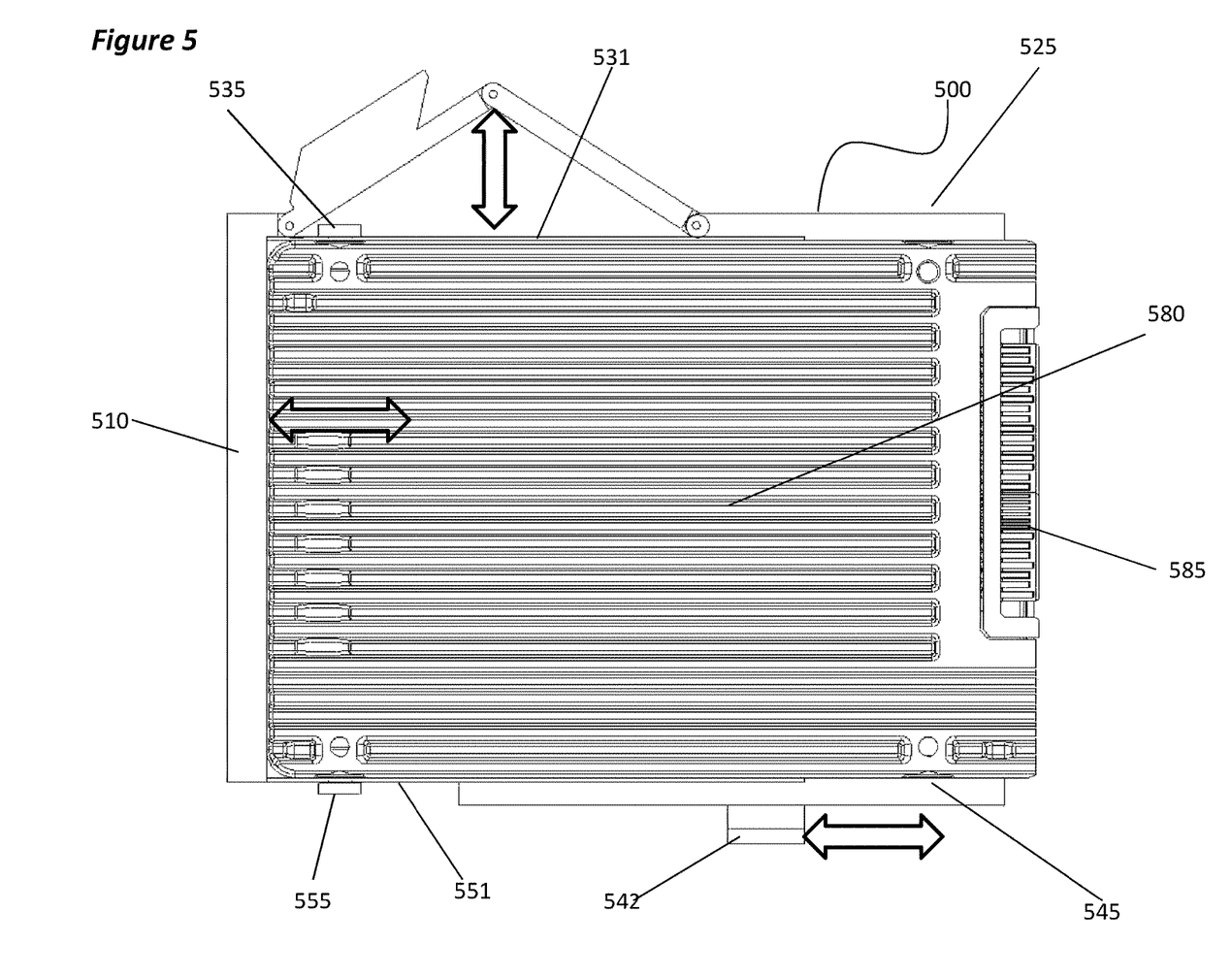
FIG. 5 illustrates an isometric view of a drive carrier with an SFF drive installed therein.

FIG. 5 illustrates a side view of a drive carrier 500 including a drive 580 mounted therein in the retracted configuration with the scissor mechanism in the raised position and the drive 580 pushed against the front plate 510. When the assembly is top loaded, the drive connector 585 clears the mating socket on the drive plane and a key 542 inserts into the alignment keyhole of the enclosure. The drive 580 may be attached to the carrier assembly using screws at locations 525 and 545 and mounting structures 535 and 555 in the slots of plates 531 and 551.

Figure 6:
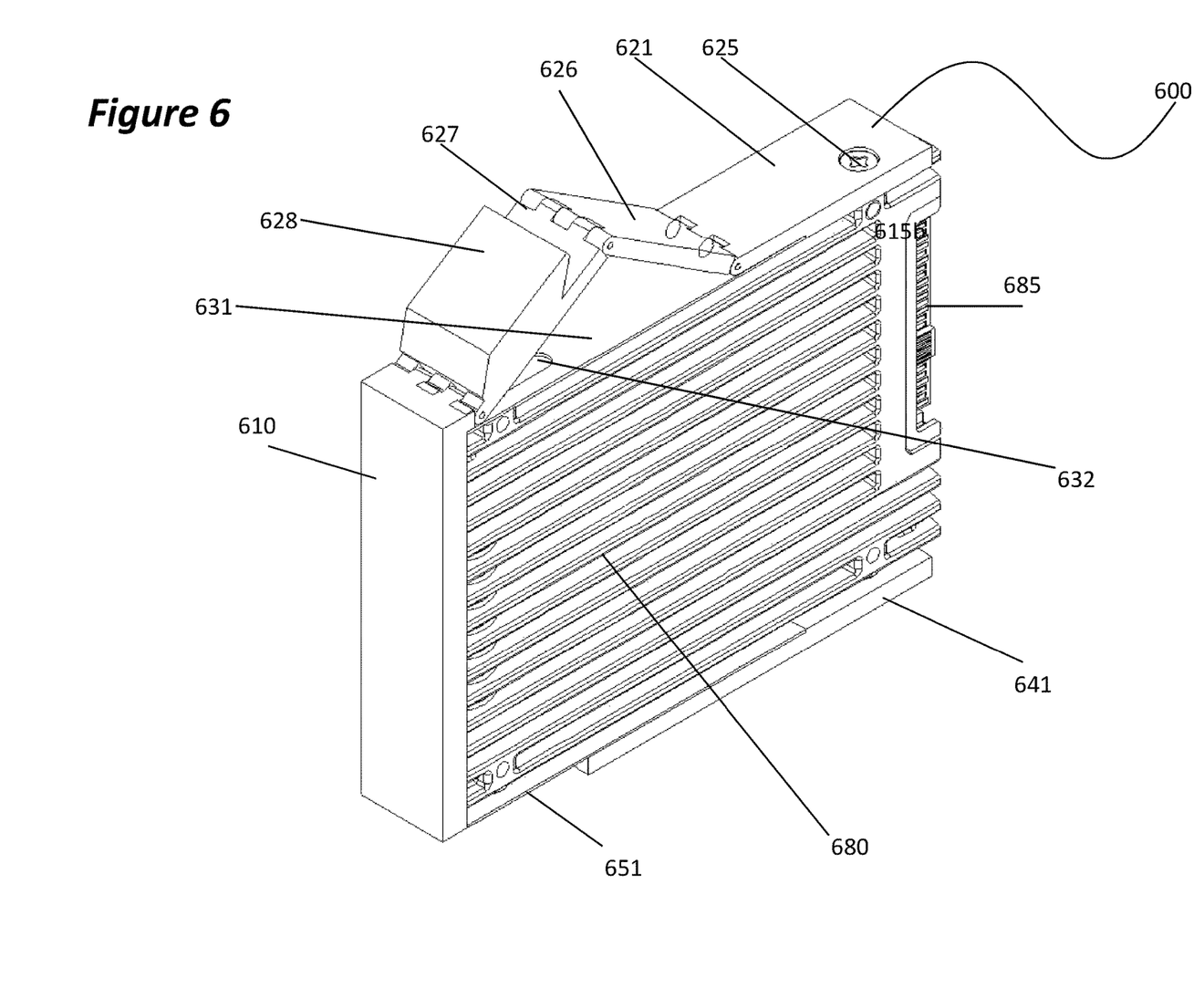
FIG. 6 illustrates a side view of the drive carrier with a drive in the retracted position.

FIG. 6 shows an isometric view of a drive carrier 600 with a drive 680 mounted therein in a retracted configuration. A slot 632 in the upper plate 631 allows the drive 680 to travel in the longitudinal direction when the scissor mechanism, constructed from the two members 626, 627, is raised into the folded configuration by lifting the latch 628. The folding of the scissor mechanism pulls the upper rail 621 (or first distal sliding rail), attached to the drive 680 by the screw 625, in the direction of the front plate 610, thereby disengaging the connector 685 from its mating connector in a drive plane. The lower rail 641 slides on the lower slotted plate 651 in substantially the same manner as the upper rail 621 (or first distal sliding rail) relative to the upper fixed plate 631.

Figure 7:
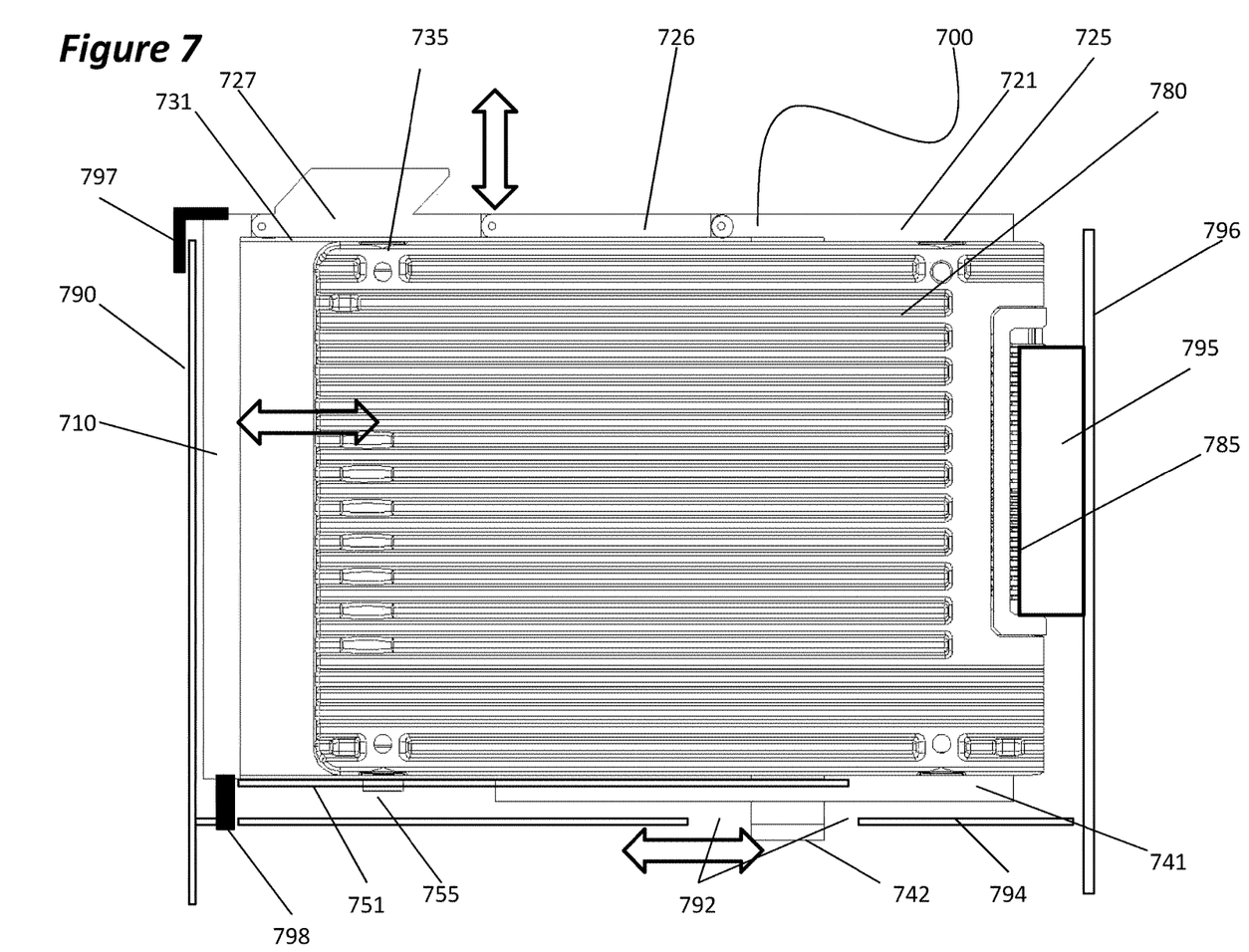
FIG. 7 illustrates a side view of the drive carrier with a drive in the extended position.

FIG. 7 shows a side view of a drive carrier 700 with a drive 780 installed. A front plate 710 may be opposed to and engage with an enclosure partition wall 790. The scissor mechanism 726, 727 (similar to the scissor mechanisms in FIGS. 5 and 6) is in a flat or extended position and pushing rail 721 (or first distal sliding rail), sliding on the upper fixed plate 731, away from the front plate 710 and towards a drive plane 796 with a suitable socket 795 juxtaposed to the drive connector 785. The drive 780 is fixed to the upper rail 721 (or first distal sliding rail) by a screw 725 and moves with the rail 721, thereby engaging the connector 785 into the socket 795. The lower rail 741, slideably attached to lower plate 751 also moves with the drive, wherein the key 742 slides within the keyhole 792 in the bottom plate 794 of the drive compartment for alignment and securing the drive in its slot. Alignment structures 735 and 755 secure the drive 780 within the drive carrier assembly 700. Additional retention features 797 and 798 keep the drive carrier aligned with the enclosure partition and prevent it from sliding towards the drive plane 796 instead of disengaging the drive connector 785 from the drive plane connector 795.

Figure 8:
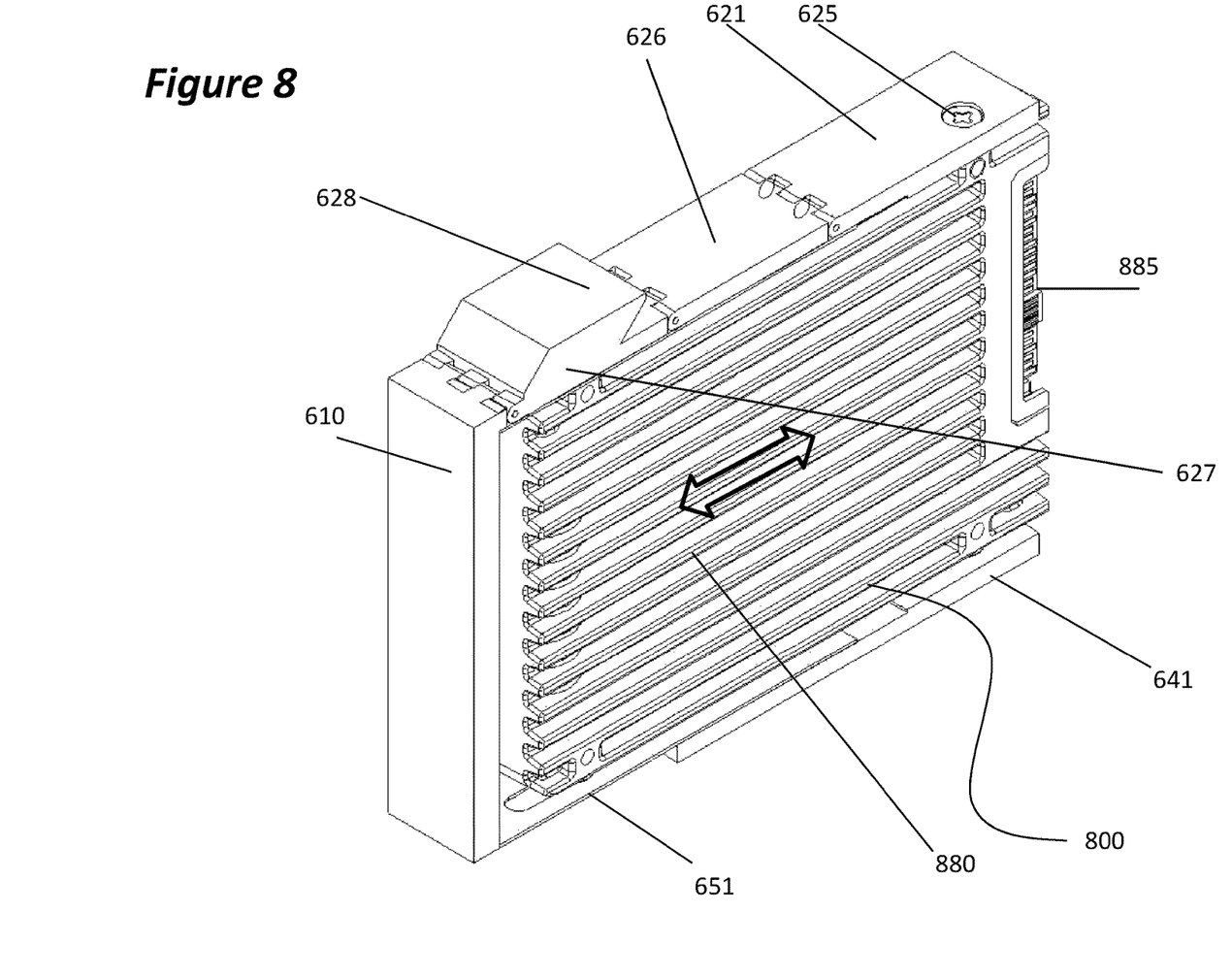
FIG. 8 illustrates an isometric view of the drive carrier with a drive in the extended position.

FIG. 8 shows an isometric view of the extended configuration of the drive carrier assembly 800 with the drive 880 installed. As shown, the scissor mechanism is in the flat/extended position, pushing the drive away from the front plate.

A particular aspect of the present disclosure is a method to install side-loading storage devices in a top loading manner into a computer chassis using an extendable scissor drive carrier. The carrier assembly, including the drive mounted therein, is inserted into the enclosure in the retracted state with the scissor actuator folded. Once the assembly is in the proper drive slot, the scissor mechanism is flattened resulting in extension of the scissor which in turn moves the drive towards a drive plane where it engages with a system connector or interface.

Referring again to FIGS. 4A and 4B, the general operation of the drive carrier assembly illustrating an isometric view of the two possible states us shown. In FIG. 4A, the drive carrier 400 has the front plate 410 extending into the upper bracket assembly 420 and the lower bracket assembly 440. As described previously, the upper bracket assembly has four main parts: the first distal sliding rail 421, the first static plate 431 (or upper fixed plate), the first scissor member 426 and the second scissor member 427. The first distal sliding rail 421 may have a first structure 425 configured to engage with a mounting hole in a 2.5" SFF drive and secure the drive against the first distal sliding rail 421. The first structure 425 may be a screw or pin or any other suitable structure to engage an SFF drive with rail 421. The first distal sliding rail 421 is configured to slide in a long axis against the first static plate 431 (or upper fixed plate) to either an extended position or, as shown in FIG. 4A to a retracted position. The first static plate 431 (or upper fixed plate) has the elongated slot 432 in which a second structure such as a pin or screw not shown) configured to engage with a drive can travel in the long axis direction.

The sliding of the first distal sliding rail 421 against the first static plate 431 (or upper fixed plate) is actuated by a scissor structure having, as described above, a first member 426 attached with a first pivot pin 424 to the first distal sliding rail 421 and a second pivot pin 423 against a second member 427, which, in turn, is attached with a third pivot pin 422 to either the front plate 410 or the first static plate 431 (or upper fixed plate). The latch 428 which is used for manual operation of the scissor structure may be part of the first member 426 or as shown in FIGS. 4A and 4B of the second member 427.

The lower bracket assembly 440 may have the second distal sliding rail 441 sliding on the second static plate 450 (or lower fixed plate). As described previously, the second distal sliding rail 441 may have the structure 445 similar to the first structure 425 as well as a key structure designed to engage with a keyhole guide slot in the enclosure to facilitate alignment of the drive's connector with the mating counterpart on the drive plane. The second static plate 450 (or lower fixed plate) has an elongated slot 452 in the longitudinal direction to allow structure 455 designed to engage with the drive to travel longitudinally.

In the retracted configuration, the drive carrier 400 may be dropped from the top into an enclosure whereby the alignment key is inserted into an alignment keyhole slot of the enclosure. When the latch 428 is pushed down, the scissor mechanism extends and pushes the distal rails away from the front plate 410. This causes the drive to travel away from the front plate 410 and to engage with a connector mounted on a drive plate.

FIG. 4B shows the same drive carrier as FIG. 4A, however with the scissor mechanism pushed down, thereby forcing the upper rail 421 into the extended position. If a drive is installed into the carrier, the lower rail 441 is forced to follow the movement of the upper rail 421 and travel a distance 446 away from the front plate 410.

FIG. 5 illustrates a side view of the drive carrier 500 including a drive 580 mounted therein in the retracted configuration with the scissor mechanism in the raised position and the drive 580 pushed against the front plate 510. When the assembly is top loaded, the drive connector 585 clears the mating socket on the drive plane and the key 542 inserts into the alignment keyhole of the enclosure. The drive 580 is attached to the carrier assembly using screws at locations 525 and 545 and mounting structures 535 and 555 in the slots of plates 531 and 551.

FIG. 6 shows an isometric view of the drive carrier 600 with the drive 680 mounted therein in the retracted configuration. The slot 632 in the upper fixed plate 631 allows the drive to travel in longitudinal direction when the scissor mechanism, constructed, from the two members 626, 627 is raised into the folded configuration by lifting the latch 628. The folding of the scissor mechanism pulls the upper rail 621, attached to the drive 680 by the screw 625, in the direction of the front plate 610, thereby disengaging connector 685 from its mating connector in a drive plane. The lower rail 641 slides on the lower slotted plate 651 in substantially the same manner as the upper rail 621 relative to the upper fixed plate 631.

FIG. 7 shows a side view of the drive carrier 700 with the drive 780 installed. The front plate 710 may be opposed to and engage with an enclosure partition wall 790. The scissor mechanism 726, 727 is in the flat or extended position and pushing upper rail 721, sliding on the upper fixed plate 731, away from the front plate 710 and towards a drive plane 796 with a suitable socket 795 juxtaposed to the drive connector 785. The drive 780 is fixed to the upper rail 721 (or first distal sliding rail) by a screw 725 and moves with the upper rail 721 (or first distal sliding rail), thereby engaging the connector 785 into the socket 795. A lower rail 741 (or second distal sliding rail), slideably attached to a lower fixed plate 751, also moves with the drive 780, wherein the key 742 slides within the keyhole 792 in the bottom plate 794 of the drive compartment for alignment and securing the drive 780 in its slot. Alignment structures 735 and 755 secure the drive 780 within the drive carrier assembly 700. Additional retention structures 797 and 798 keep the drive carrier aligned with the enclosure partition and prevent it from sliding towards the drive plane 796 instead of disengaging the drive connector 785 from the drive plane connector 795.

FIG. 8 shows an isometric view of the extended configuration of a drive carrier assembly 800 with a drive 880 installed. The scissor mechanism (similar to the scissor mechanisms in FIGS. 5-7) is in the flat/extended position, pushing the drive 880 away from the front plate.

Another specific aspect of the present disclosure is the method of removing a memory device assembled with a drive carrier from a computer enclosure through a top-loading mechanism from a vertically oriented drive plane using a reticulated or scissor mechanism to move the drive within a drive carrier in a direction normal to the loading direction of the enclosure. The method comprises retracting the drive from an extended position to a retracted position closer to a front plate of the drive carrier by pulling a latch attached to a scissor mechanism to move the scissor mechanism into a folded configuration, thereby retracting a sliding rail towards a front plate of the drive carrier. The memory device is attached to the sliding rail and moves together with the sliding rail into a retracted position, thereby allowing a connector to disengage from a drive plane connector mounted on a drive plane and a key as part of a lower extension of the drive carrier to disengage from an alignment and retention keyhole. Lifting the drive carrier assembly from the computer enclosure through a top loading access port.

While the present disclosure has been described in form of specific and preferred embodiments and form factors, it is foreseeable that functionally equivalent designs could be used or subsequently developed to perform the intended functions of the tiled architecture. For example, different generations of CPU and interconnect standards beyond PCIe or Quick/Ultra Path Interconnect may be implemented. Therefore, it is apparent that other forms could be adopted by one skilled in the art. Finally, while the appended claims recite certain aspects believed to be associated with the present disclosure and investigations discussed above, they do not necessarily serve as limitations to the scope of the present disclosure.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

Accordingly, the various features associate with the examples described herein and shown in the accompanying drawings can be implemented in different examples and implementations without departing from the scope of the disclosure. Therefore, although certain specific constructions and arrangements have been described and shown in the accompanying drawings, such implementations are merely illustrative and not restrictive of the scope of the disclosure, since various other additions and modifications to, and deletions from, the described implementations will be apparent to one of ordinary skill in the art. Thus, the scope of the disclosure is only determined by the literal language, and legal equivalents, of the claims which follow.

What is claimed is:

1. A computer system having an enclosure configured to accept a plurality of mass storage devices, comprising:
    a carrier assembly, assembled with one of the mass storage devices, adapted to actuate between a retracted state to an extended state, the carrier assembly comprises:
        a front plate extending into an upper fixed plate;
        a lower fixed plate;
        an upper sliding rail attached to the upper fixed plate; and
        a lower sliding rail slideably attached to the lower fixed plate; and
    a scissor mechanism, secured to the carrier assembly, which actuates the carrier assembly between the retracted and the extended state;
    wherein the retracted state is used to insert the carrier assembly into the enclosure, and
    wherein the extended state is used to engage the mass storage device with a connector of the computer system;
    wherein each of the upper and lower fixed plates of the carrier assembly have an elongated hole configured to allow for travel of a retaining structure securing the mass storage device within the carrier assembly.

2. The computer system of claim 1,
    wherein the scissor mechanism comprises a first member pivoting against the front plate and a second member pivoting against the upper sliding rail;
    wherein folding the scissor mechanism retracts the upper sliding rail towards the front plate; and
    wherein flattening the scissor mechanism extends the upper sliding rail away from the front plate.

3. The carrier assembly of claim 1, further comprising:
    a first fastening structure of the upper sliding rail to attach to mass storage device; and
    a second fastening structure of the lower sliding rail to attach to the mass storage device;
    wherein the lower sliding rail moving in the same manner as the upper slide rail when the scissor mechanism is actuated.

4. The carrier assembly of claim 3, wherein the enclosure comprises:
    a key; and
    a key-hole, located in the lower fixed plate, where the key extends into the key-hole and secures the carrier assembly in the extended state within enclosure retention features to maintain alignment of the carrier assembly with the enclosure.

5. The carrier assembly of claim 1, wherein a member of the scissor mechanism extends into a latch.

6. A method for inserting a mass storage device into a storage enclosure, the method comprising:
    installing the mass storage device in a carrier assembly, the carrier assembly comprising:
        a front plate extending into an upper fixed plate and a lower fixed plate;
        an upper sliding rail attached to the upper fixed plate and a lower sliding rail attached to the lower fixed plate; and
        wherein each of the upper and lower fixed plates of the carrier assembly have an elongated hole configured to allow for travel of a retaining structure securing the mass storage device within the carrier assembly; and
    actuating a scissor mechanism on the carrier assembly from a flat configuration to a folded configuration to change the state of the carrier assembly from an extended state to a retracted state;
    inserting the carrier assembly into a drive slot in the storage enclosure;
    actuating the scissor mechanism from the folded configuration to the flat configuration to change the state of the carrier assembly from the retracted state to the extended state.

7. The method of claim 6,
    wherein the scissor mechanism includes a first member pivoting against the front plate and a second member pivoting against the upper sliding rail;
    wherein folding the scissor mechanism retracts the upper sliding rail towards the front plate; and
    wherein flattening the scissor mechanism extends the upper sliding rail away from the front plate.

8. The method of claim 7, further comprising:
    using a first fastening structure of the upper sliding rail to attach to the mass storage device and a second fastening structure of the lower sliding rail to attach to the mass storage device; and wherein the lower sliding rail moves in the same way as the upper slide rail when the scissor mechanism is actuated.

9. The method of claim 8, further comprising:
    using a key extension of the lower sliding rail to engage with a key-hole in the enclosure, the key extension securing the carrier assembly in the extended state within the enclosure retention features to maintain alignment of the carrier assembly with a structure of the enclosure.

10. The method of claim 7, wherein the upper and lower fixed plates have an elongated hole configured to allow for travel of a retaining structure securing the mass storage device within the carrier assembly.

11. The method of claim 10, wherein a member of the scissor mechanism extends into a latch.

12. A method for removing a mass storage device from a storage enclosure, the method comprising the following steps:
   actuating a scissor mechanism on a carrier assembly securing the mass storage device in a drive slot of the storage enclosure from a flat configuration to a folded configuration to change the state of the carrier assembly from an extended state to a retracted state, wherein the carrier assembly comprises:
      a front plate extending into an upper fixed plate and a lower fixed plate; and
      an upper sliding rail attached to the upper fixed plate and a lower sliding rail attached to the lower fixed plate; and
   removing the carrier assembly from the drive slot;
   using a key extension of the lower sliding rail to engage with a key-hole in the enclosure, the key extension securing the carrier assembly in the extended state within the enclosure and retention features to maintain alignment of the carrier assembly with a structure of the enclosure.

13. The method of claim 12,
   wherein the scissor mechanism has a first member pivoting against the front plate and a second member pivoting against the upper sliding rail;
   wherein folding the scissor mechanism retracts the upper sliding rail towards the front plate; and
   wherein flattening the scissor mechanism extends the upper sliding rail away from the front plate.

14. The method of claim 13, further comprising:
   using a first fastening structure of the upper sliding rail to attach to a mass storage device and a second fastening structure of the lower sliding rail to attach to the mass storage device; and
wherein the lower sliding rail moving in substantially the same way as the upper slide rail when the scissor mechanism is actuated.

15. The method of claim 12, wherein the upper and lower fixed plates have an elongated hole configured to allow for travel of a retaining structure securing the mass storage device within the carrier assembly.

16. The method of claim 15, wherein a member of the scissor mechanism extends into a latch.

\* \* \* \* \*